US006542372B1

(12) United States Patent
Paquin et al.

(10) Patent No.: US 6,542,372 B1
(45) Date of Patent: Apr. 1, 2003

(54) CHASSIS-MOUNTED BUMPER FOR A CIRCUIT BOARD

(75) Inventors: David M. Paquin, Cypress, TX (US); David A. Selvidge, Houston, TX (US)

(73) Assignee: Hewlett-Packard Development Company, L.P., Palo Alto, CA (US)

( * ) Notice: Subject to any disclaimer, the term of this patent is extended or adjusted under 35 U.S.C. 154(b) by 0 days.

(21) Appl. No.: 09/962,869

(22) Filed: Sep. 25, 2001

(51) Int. Cl.[7] .............................. H05K 7/14; H05K 1/14
(52) U.S. Cl. .................... 361/758; 361/770; 361/804; 174/138 G
(58) Field of Search ................... 361/741, 742, 361/752, 758, 759, 804, 770; 174/138 G

(56) References Cited

U.S. PATENT DOCUMENTS 4,100,368 A * 7/1978 Thomsen ................ 174/38 D
4,167,772 A * 9/1979 Baehne ................... 361/399
5,825,633 A * 10/1998 Bujaski et al. ............ 361/804
6,377,445 B1 * 4/2002 Davis et al. .............. 361/683

* cited by examiner

Primary Examiner—Randy W. Gibson
Assistant Examiner—Dameon E. Levi
(74) Attorney, Agent, or Firm—Akin Gump Strauss Hauer & Feld LLP

(57) ABSTRACT

An spacer assembly for spacing a circuit board from a chassis includes a plug that is adapted to extend through a mounting aperture in the chassis and a cap that is adapted to receive the plug in locking engagement for sandwiching the chassis therebetween. The cap has an upper wall that supports the circuit board and a skirt that extends from the upper wall to form a hollow interior that is sized to receive the plug. First cooperating structure on the plug and cap hold the plug within the hollow interior of the cap, while second cooperating structure on the plug and cap hold the chassis therebetween.

21 Claims, 3 Drawing Sheets

CHASSIS-MOUNTED BUMPER FOR A CIRCUIT BOARD

CROSS-REFERENCE TO RELATED APPLICATIONS

Not applicable.

STATEMENTS REGARDING FEDERALLY SPONSORED RESEARCH OR DEVELOPMENT

Not applicable.

REFERENCE TO A MICROFICHE APPENDIX

Not applicable.

BACKGROUND OF THE INVENTION

1. Field of the Invention

This invention relates to mounting assemblies for electronics, and more particularly to a bumper for spacing a circuit board from a chassis or other supporting member.

2. Description of the Related Art

Supports for system boards or other circuit boards typically require either metal standoffs in the form of a screw or a spacer that is screw-mounted to an electrical chassis for spacing the circuit board a predetermined distance from the chassis. Installation of the screws and/or standoffs at predetermined locations on the chassis requires additional time and processing steps. Other supports include bumpers or spacers with an adhesive coating that is placed in contact with the electrical chassis. The bumpers may become loose or separated from the chassis due to vibration, dirt accumulation, contaminants on the chassis prior to mounting, and so on. When one or more bumpers become loose, the circuit board mounting may become unstable and cause stress-induced failure of the circuit board and/or of the electrical components mounted thereto.

It would therefore be desirable to provide a spacer for spacing a circuit board from a chassis in a relatively quick and reliable manner.

SUMMARY OF THE INVENTION

According to one aspect of the invention, a spacer assembly for spacing a circuit board from a chassis is provided. The spacer assembly comprises a plug adapted to extend through a mounting aperture in the chassis and a cap that is adapted to receive the plug for sandwiching the chassis therebetween. The cap has an upper wall for supporting a circuit board and a skirt that extends from the upper wall to form a hollow interior sized to receive the plug. First cooperating structure on the plug and cap hold the plug within the hollow interior of the cap. Second cooperating structure on the plug and cap hold the chassis therebetween.

According to a further aspect of the invention, an electronic assembly comprises a chassis, a circuit board spaced from the chassis, and a spacer positioned between the chassis and the circuit board. The spacer comprises a plug extending through a mounting aperture of the chassis, and a cap that receives the plug.

The plug has a base member in contact with a first chassis surface, an intermediate member that extends from the base member, and a first locking member that is associated with the intermediate member.

The cap has an upper wall that supports the circuit board and a skirt that extends from the upper wall to form a hollow interior sized to receive the plug. The skirt has a lower surface that contacts a second chassis surface opposite the first chassis surface, and a second locking member that is associated with the hollow interior. The first and second locking members are mutually engaged to thereby secure the plug to the cap with the chassis positioned therebetween.

According to an even further aspect of the invention, a method of spacing a circuit board from a support member comprises forming a mounting aperture in the support member; providing a plug with a first locking surface and a first engaging surface spaced from the first locking surface; providing a cap with an upper wall, a skirt extending from the upper wall to form a hollow interior, a second locking surface located in the hollow interior and a second engaging surface located on the skirt; inserting the plug through the mounting aperture until the first engaging surface is in contact with the support member; pressing the cap onto the plug until the first locking surface engages the second locking surface in the hollow interior and the second engaging surface contacts the support member opposite the first engaging surface to thereby sandwich and securely hold the support member between the plug and the cap.

BRIEF DESCRIPTION OF THE SEVERAL VIEWS OF THE DRAWINGS

Embodiments of the present invention will hereinafter be described in conjunction with the appended drawings, wherein.

Embodiments of the present invention will now be described in greater detail with reference to the drawings, wherein like parts throughout the drawing figures are represented by like numerals.

DETAILED DESCRIPTION OF THE INVENTION

Figure 1:
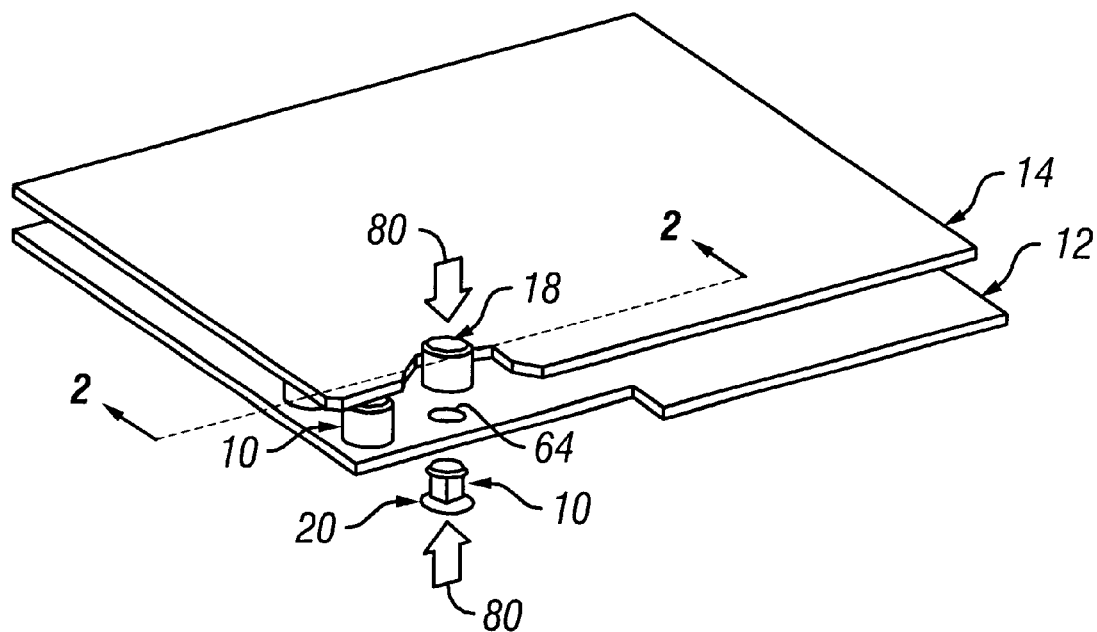
FIG. 1 is an isometric view of an electronic assembly with a circuit board, a chassis, and a bumper assembly for spacing the circuit board from the chassis according to one embodiment of the present invention.
Figure 2:
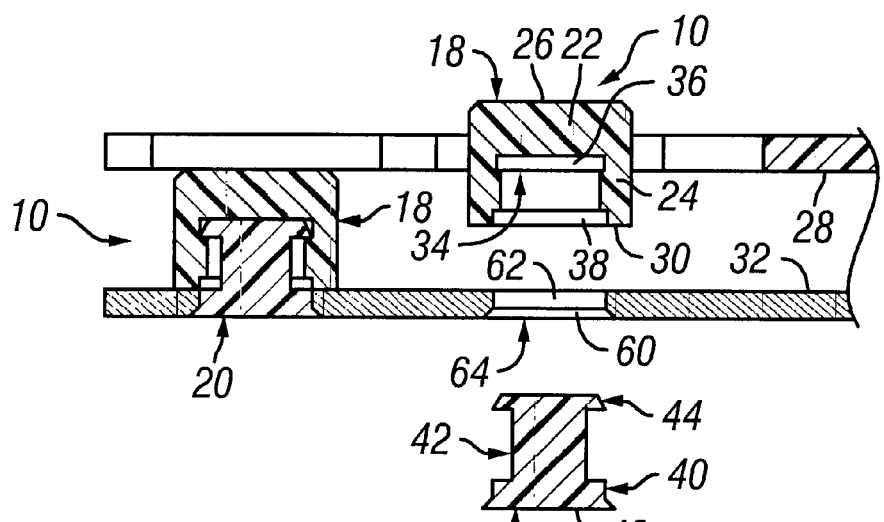
FIG. 2 is a sectional view of the bumper assembly taken along line 2—2 of FIG. 1.

Referring now to the drawings, and to FIGS. 1 and 2 in particular, there is illustrated a bumper assembly 10 in accordance with an embodiment of the invention for use with a chassis 12 or other mounting structure and a circuit board 14. The bumper assembly 10 includes a cap 18 and a plug 20 that is lockably received in the cap, with the chassis 12 sandwiched between the cap and plug. By way of example, the chassis 12 may be an electrical chassis constructed of sheet metal or the like for housing or mounting electronic components, and the circuit board 14 may be a systems board for mounting to the chassis in a spaced-apart manner. It will be understood that the mounting structure is not limited to the chassis 12, but may include other circuit boards, electronic enclosures, support surfaces, and so on. It will be further understood that the bumper assembly 10 is not limited for use with the chassis 12 and circuit board 14, but may be used in other environments where it is desirous to space one element from another.

Figure 3:
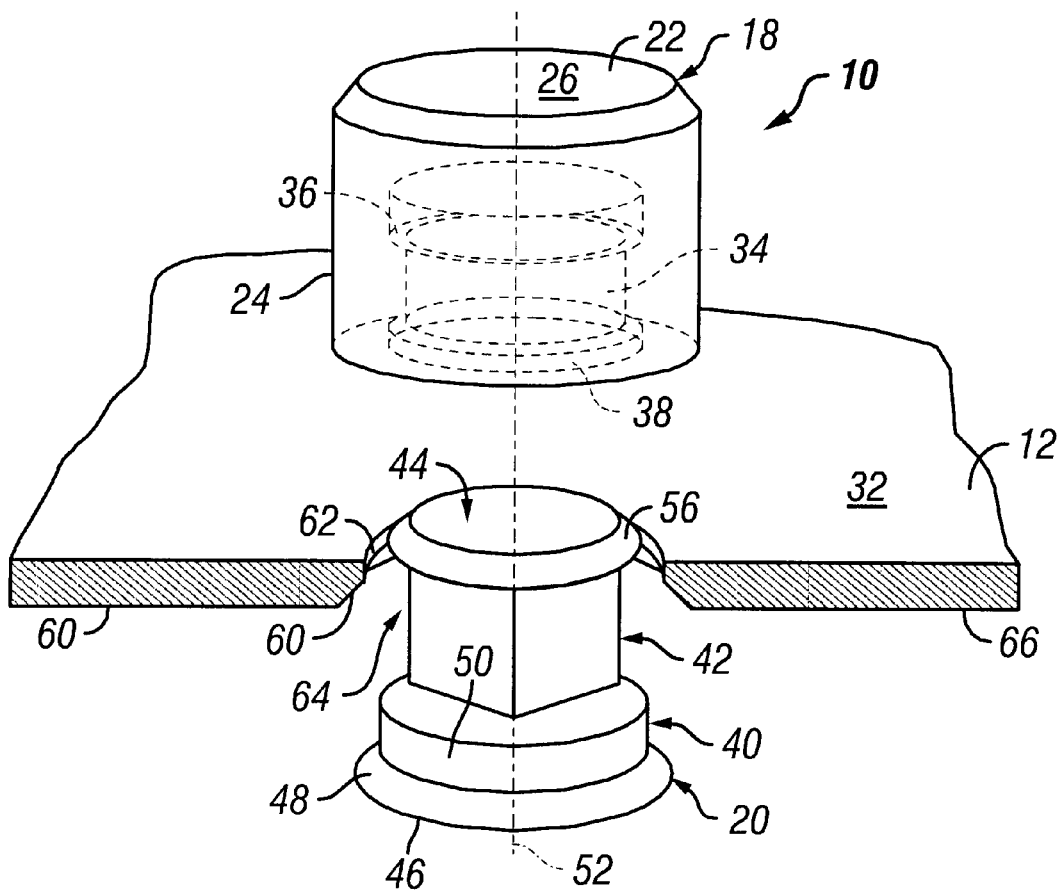
FIG. 3 is an enlarged isometric view of the bumper assembly of FIG. 1 for mounting to a structure.

With additional reference to FIG. 3, the cap 18 includes an upper wall 22 and a skirt 24 that extends downwardly from the upper wall. An upper surface 26 of the upper wall is adapted to contact a lower surface 28 (FIG. 2) of the circuit board 14 and a lower surface 30 of the skirt 24 is adapted to contact an upper surface 32 of the chassis 12 when the cap 18 is mounted to the chassis. The upper wall 22 together with the skirt 24 form a hollow interior 34 into which a portion of the plug 20 is received in locking engagement, as will be described in greater detail below. An upper annular groove 36 and a lower annular groove 38 are formed on the skirt 24 in the hollow interior 34. Preferably, the upper annular groove is located adjacent the upper wall 22 and the lower annular groove 38 is located adjacent the lower skirt surface 30. The cap 18 is preferably constructed of an insulating material, such as nylon, to thereby electrically isolate the circuit board 14 from the chassis 12. It will be understood that other materials, such as thermoplastics or elastomers, can be used for the cap 18. Where it is desirous to ground the circuit board 14 to the chassis, the cap 18 can be constructed of metal or other conductive material.

The plug 20 includes a base member 40, an intermediate member 42 extending upwardly from the base member, and a locking member 44 connected to the intermediate member 42. The plug 20 is preferably integrally molded of a non-conductive plastic material, such as nylon, but may alternatively be constructed of other plastics, metal or other material.

As shown in FIG. 3, the base member 40 has a lower surface 46, a first circumferential side surface 48 that preferably extends at an acute angle with respect to the lower surface 46, and a second circumferential side surface 50 that preferably extends parallel with a central axis 52 of the plug 20. The first and second side surfaces 48 are adapted to engage the side surfaces 60 and 62, respectively, of a countersunk mounting aperture or opening 64 formed in the chassis 12. In this manner, the lower surface 46 of the base member 40 is flush with a lower surface 66 of the chassis 12 when the base member is mounted in the opening, as shown in FIG. 4.

The intermediate member 42 can be square-shaped in cross section as shown, although other cross sectional shapes are contemplated. The intermediate member is preferably smaller at its largest cross dimension, i.e. corner to corner when square-shaped, than the largest diameter of the locking member 44.

Figure 4:
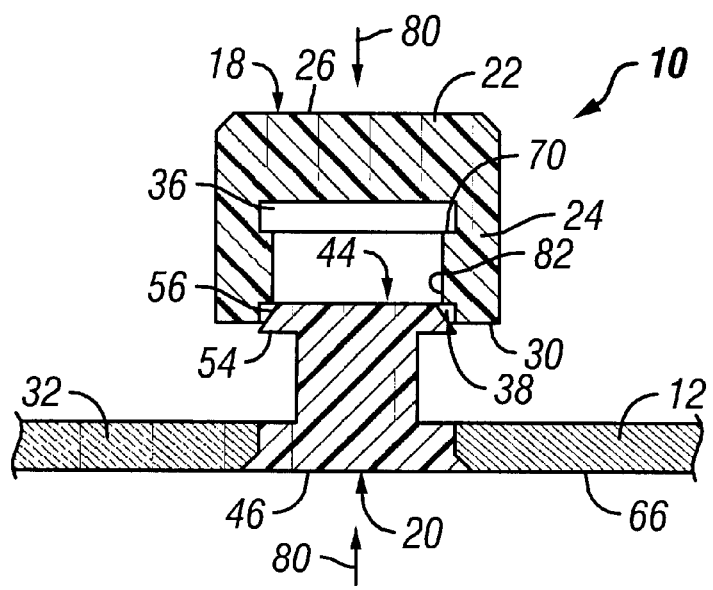
FIG. 4 is a sectional view of the bumper assembly at a first mounting stage.

As best shown in FIG. 4, the locking member 44 is preferably frusto-conical in shape and has a lower locking surface 54 and a wedge surface 56 that extends at an acute angle with respect to the lower locking surface. The lower locking surface 54 is adapted to contact a locking surface 70 of the upper annular groove 36 in order to affix the cap 18 to the plug 20. It will be understood that the locking member 44 may alternatively be in the form of a cylinder or other shape. In yet a further embodiment, the locking member 44 can comprise one or more locking tabs that extend from the intermediate member 42 for engaging the locking surface 70 of the groove 36.

Figure 5:
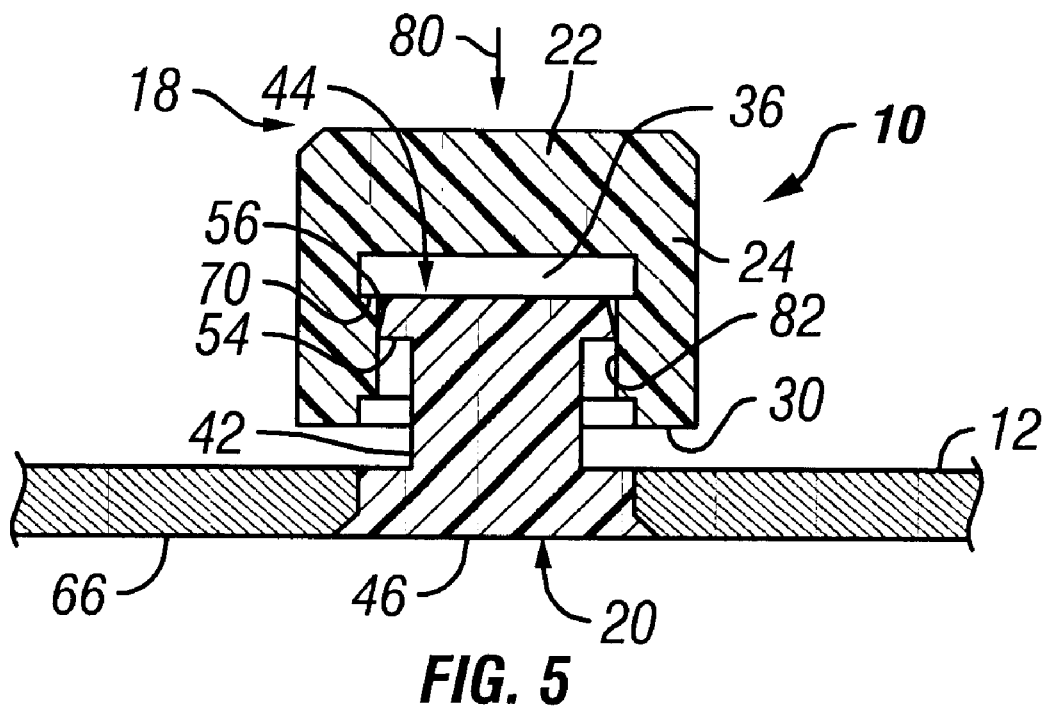
FIG. 5 is a sectional view of the bumper assembly at a second mounting stage.
Figure 6:
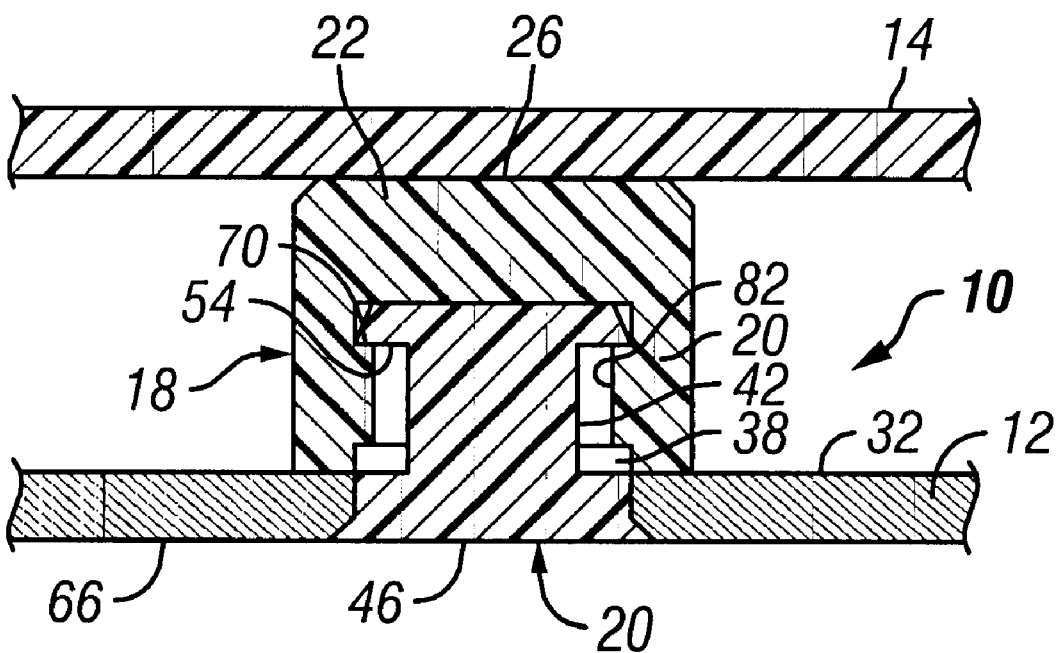
FIG. 6 is a sectional view of the bumper assembly at a final mounting stage.

In order to mount the bumper assembly 10 to the chassis 12, as shown in FIGS. 4–6, the plug 20 is inserted into the countersunk opening 64 of the chassis 12 until the surfaces 48 and 50 of the plug 20 engage the surfaces 60 and 62 of the chassis 12. In this position, the lower surface 46 of the plug 20 is preferably flush with the lower surface 66 of the chassis 12, as shown in FIG. 4. The cap 18 is then positioned over the plug 20 such that the lower annular groove 38 of the cap 18 is in contact with the locking member 44 of the plug 20. The annular groove 38 facilitates centering the cap on the plug. Downward pressure on the cap 18 in a direction represented by arrow 80 in FIG. 4 causes the wedge surface 56 to slide against an inner annular surface 82 of the cap 18, thereby expanding the skirt 24 and/or reducing the diameter of the locking member 44, as shown in FIG. 5. Further downward movement of the cap 18 causes the locking member 44 to enter the upper annular groove 36 of the cap until the locking surface 54 of the locking member abuts the locking surface 70 of the upper annular groove 36. In this position, the lower surface 30 of the skirt 24 preferably abuts the upper surface 32 of the chassis 12. Accordingly, the cap 18 is securely held on the plug 20 with the chassis 12 sandwiched therebetween, as shown in FIG. 6. A circuit board 14 or other structure can then be positioned on the upper surface 26 of the cap 18 to thereby space the circuit board a predetermined distance away from the chassis 12. The predetermined distance can be adjusted by changing the lengths of the skirt 24 and plug 20. Thus, the bumper assembly 10 is secured to the chassis 12 in a quick and easy manner.

Although the bumper assembly 10 has been described for mounting in a single opening, it will be understood that a plurality of bumper assemblies can be mounted in a like number of openings for providing further support to the circuit board 14 or other structure. The openings 64 for the spacer assemblies 10 need not be circular or countersunk, but can have a variety of different shapes. The bumper assembly 10 can also have a variety of different shapes to accommodate the shape of the opening.

It will be understood that the terms upper, lower, upwardly, downwardly, outer, inner, and their respective derivatives and equivalent terms as may be used throughout the specification, refer to relative, rather than absolute orientations and/or positions.

While the invention has been taught with specific reference to the above-described embodiments, those skilled in the art will recognize that changes can be made in form and detail without departing from the spirit and the scope of the invention. By way of example, the bumper assembly can be mounted in openings formed in the circuit board for spacing the circuit board from the chassis or other support structure. Thus, the described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A spacer assembly for spacing a circuit board from a support member, the support member having at least one mounting aperture, the spacer assembly comprising:

a cap having an upper wall for supporting a circuit board, a skirt extending from the upper wall to form a hollow interior sized to receive the plug, and a first locking member associated with the skirt;

a plug adapted to extend through the at least one mounting aperture, the plug having a generally smooth intermediate member for linear insertion into the hollow interior of the cap and a second locking member associated with the intermediate member for engaging the first locking member to thereby hold the plug within the hollow interior of the cap; and cooperating structure on the plug and cap for holding the support member therebetween.

2. A spacer assembly according to claim 1, wherein one of the first and second locking members comprises a groove and the other of the first and second locking members comprises a projection for cooperating with the groove.

3. A spacer assembly according to claim 2, wherein the groove is formed in the hollow interior of the cap and the projection is formed on the plug.

4. A spacer assembly according to claim 3, wherein the plug further comprises a base member adapted for contacting the support member, with the intermediate member extending from the base member, and the projection extending radially from a distal end of the intermediate member.

5. A spacer assembly according to claim 4, wherein the at least one mounting aperture is a countersunk aperture having a first aperture surface and a second aperture surface that extends at an angle with respect to the first aperture surface, and further wherein the base member includes a first base surface and a second base surface that extends at an angle with respect to the first base surface to thereby mate with the first and second aperture surfaces, respectively, when the plug is positioned in the mounting aperture.

6. A spacer assembly according to claim 4, wherein the projection comprises a first annular locking surface and the groove comprises a second annular locking surface that engages with the first annular locking surface to thereby hold the cap and plug together.

7. A spacer assembly according to claim 6, wherein the projection further comprises an annular wedge surface that extends at an acute angle with respect to the first annular locking surface to thereby engage an inner surface of the hollow interior of the cap during linear insertion of the plug into the cap.

8. A spacer assembly according to claim 6, wherein the groove is an annular groove formed adjacent an intersection between the upper wall and the skirt.

9. A spacer assembly according to claim 2, wherein the projection comprises a first annular locking surface and the groove comprises a second annular locking surface that engages with the first annular locking surface to thereby hold the cap and plug together.

10. A spacer assembly according to claim 9, wherein the groove is formed adjacent an intersection between the upper wall and the skirt of the cap.

11. A spacer assembly according to claim 9, wherein the projection further comprises an annular wedge surface that extends at an acute angle with respect to the first annular locking surface to thereby engage an inner surface of the hollow interior of the cap during linear insertion of the plug into the cap.

12. A spacer assembly according to claim 1, wherein the at least one mounting aperture is a countersunk aperture having a first aperture surface and a second aperture surface that extends at an angle with respect to the first aperture surface, and further wherein the plug comprises a base member connected to the intermediate member, the base member being adapted for contacting the support member, the base member including a first base surface and a second base surface that extends at an angle with respect to the first base surface to thereby mate with the first and second aperture surfaces, respectively, when the plug is positioned in the mounting aperture.

13. A spacer assembly according to claim 1, wherein the cooperating structure comprises a lower surface of the skirt that is adapted to contact a first surface of the support member and a base member connected to the intermediate member of the plug that is adapted to contact a second opposing surface of the support member.

14. An electronic assembly comprising:
   a chassis;
   at least one mounting aperture formed in the chassis;
   a circuit board spaced from the chassis; and
   a spacer positioned between the chassis and the circuit board, the spacer comprising:
      a plug extending through the at least one mounting aperture, the plug having a base member in contact with a first chassis surface, an intermediate member extending from the base member, and a first locking member associated with the intermediate member;
      a cap having an upper wall that supports the circuit board and a skirt extending from the upper wall to form a hollow interior sized to receive the plug, the skirt being spaced from the intermediate member of the plug and having a lower surface that contacts a second chassis surface opposite the first chassis surface, and a second locking member associated with the hollow interior, the first and second locking members being mutually engaged to thereby secure the plug to the cap with the chassis positioned therebetween.

15. An electronic assembly according to claim 14, wherein the first locking member comprises a first locking surface that extends transverse to a longitudinal axis of the plug, and the second locking member comprises a groove formed in the hollow interior of the cap with a second locking surface that engages the first locking surface.

16. An electronic assembly according to claim 15, wherein the first locking member further comprises a wedge surface that extends at an acute angle with respect to the first locking surface to thereby engage an inner surface of the plug hollow interior during insertion of the cap onto the plug.

17. An electronic assembly according to claim 15, wherein the groove is formed at least adjacent an intersection between the upper wall and the skirt.

18. An electronic assembly according to claim 14, wherein the at least one mounting aperture is a countersunk aperture having a first aperture surface and a second aperture surface that extends at an angle with respect to the first aperture surface, and further wherein the base member includes a first base surface and a second base surface that extends at an angle with respect to the first base surface to thereby mate with the first and second aperture surfaces, respectively.

19. A method of spacing a circuit board from a support member, the method comprising:
   forming a mounting aperture in the support member;
   providing a plug with a first locking surface and a first engaging surface spaced from the first locking surface;
   providing a cap with an upper wall, a skirt extending from the upper wall to form a hollow interior, a second locking surface located in the hollow interior and a second engaging surface located on the skirt;
   inserting the plug through the mounting aperture until the first engaging surface is in contact with the support member;
   pressing the cap onto the plug in a linear direction until the first locking surface engages the second locking surface in the hollow interior and the second engaging surface contacts the support member opposite the first engaging surface to thereby sandwich and securely hold the support member between the plug and the cap.

20. A spacer assembly according to claim 3, wherein a cross dimension of the projection is larger than an inner surface of the hollow interior, the projection being sufficiently resilient to deflect inwardly when engaging the inner surface and to deflect outwardly when located in the groove.

21. A spacer assembly according to claim 15, wherein a cross dimension of the first locking surface is larger than an inner surface of the hollow interior, the first locking surface being sufficiently resilient to deflect inwardly when engaging the inner surface and to deflect outwardly when located in the groove.

\* \* \* \* \*